(12) United States Patent
Nakagawa

(10) Patent No.: US 6,359,304 B2
(45) Date of Patent: *Mar. 19, 2002

(54) NONVOLATILE SEMICONDUCTOR MEMORY AND PROCESS FOR FABRICATING THE SAME

(75) Inventor: Ken-ichiro Nakagawa, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/449,760

(22) Filed: Nov. 26, 1999

(30) Foreign Application Priority Data

Nov. 26, 1998 (JP) .......................... 10-335171

(51) Int. Cl.[7] .............................. H01L 29/76
(52) U.S. Cl. .................. 257/314; 257/315; 257/316; 257/317
(58) Field of Search ................................ 257/314–317

(56) References Cited

U.S. PATENT DOCUMENTS 5,856,691 A  *  1/1999  Hazama ...................... 257/316

6,064,592 A  *  5/2000  Nakagawa et al. .... 365/185.05

FOREIGN PATENT DOCUMENTS

| JP | 61191052 | 8/1986 |
| JP | 774326 | 3/1995 |
| JP | 8167661 | 6/1996 |
| JP | 10308502 | 11/1998 |

* cited by examiner

*Primary Examiner*—Tom Thomas
*Assistant Examiner*—Thien F Tran
(74) *Attorney, Agent, or Firm*—Young & Thompson

(57) ABSTRACT

A nonvolatile semiconductor memory comprises a memory cell region including a number of memory cells formed therein and each having a floating gate and a control gate formed above the floating gate, a plurality of word lines extending in a first direction in parallel to each other, separately from each other, and a selection transistor region positioned adjacent to the memory cell region and including one selection transistor formed therein and a selection signal line extending in parallel to the word lines. The selection signal line is formed on an inactive region in a substrate to extend in parallel to a boundary line between the memory cell region and the selection transistor region.

14 Claims, 9 Drawing Sheets

NONVOLATILE SEMICONDUCTOR MEMORY AND PROCESS FOR FABRICATING THE SAME

BACKGROUND OF THE INVENTION

The present invention relates to a nonvolatile semiconductor memory and a process for fabricating the same, and more specifically to a nonvolatile semiconductor memory having a reduced chip area and a process for fabricating the same.

Referring to FIG. 1, there is shown a diagrammatic plan view illustrating a prior art nonvolatile semiconductor memory. FIG. 2 is a diagrammatic sectional view taken along the line D—D in FIG. 1, and FIGS. 3A and 3B are views similar to that of FIG. 2 but showing different problems in the prior art nonvolatile semiconductor memory.

In FIGS. 1, 2, 3A and 3B, Reference Number 51 designates a floating gate of a memory cell in the nonvolatile semiconductor memory, and Reference Number 52 denotes a control gate formed above the floating gate 51 and functioning as a word line. Reference Number 53 indicates an insulating film between the floating gate 51 and the control gate 52. Reference Numbers 54 and 55 show a drain and a source of the memory cell, respectively, and Reference Number 56 designates a channel region between the drain 54 and the source 55. Thus, one memory cell is formed by the drain 54, the source 55, the channel region 56 between the drain 54 and the source 55, and the floating gate 51 and the control gate 52 stacked above the channel region 56, and each memory cell is isolated by a device isolation region 57 from adjacent memory cells.

Reference Number 61 indicates a selection transistor (selector) for selecting the memory cells. The selection transistor 61 is controlled by a selection signal line 62 functioning as a gate electrode.

The nonvolatile semiconductor memory thus formed includes a memory cell region in which a number of memory cells are formed and a selection transistor region in which a plurality of selection transistors are formed. The memory cell region is adjacent to the selection transistor region, but since the memory cells and the selection transistors cannot be formed in completely the same process, when the memory cells are formed, the selection transistor region is masked, and when the selection transistors are formed, the memory cell region is masked. Therefore, because of a misalignment of the mask, an unetched portion 64 remains at a boundary between the memory cell region and the selection transistor region, as shown in FIG. 3A, and in a later process, the unetched portion 64 collapses, with the result that the yield of production is deteriorated.

Alternatively, because of the misalignment of the mask, a substrate is overetched at the boundary between the memory cell region and the selection transistor region, as shown with Reference Number 65 in FIG. 3B by two etchings, one of which is performed for forming the memory cells, and the other of which is performed for forming the selection transistors.

In order to overcome the above problems, the prior art nonvolatile semiconductor memory was so constructed to have a dummy gate line 66 between the selection transistor region and the memory cell region, as shown in FIGS. 1 and 2. However, if the dummy gate line 66 is provided, the chip area of the nonvolatile semiconductor memory inevitably becomes increased.

BRIEF SUMMARY OF THE INVENTION

Accordingly, it is an object of the present invention to provide a nonvolatile semiconductor memory which has overcome the above mentioned problem of the conventional prior art.

Another object of the present invention is to provide a nonvolatile semiconductor memory having a reduced chip area by making the dummy gate line unnecessary, and the process for fabricating the same.

Still another object of the present invention is to provide a nonvolatile semiconductor memory including the selection signal line having the function of the dummy gate line, thereby to reduce a necessary chip area, and the process for fabricating the same.

The above and other objects of the present invention are achieved in accordance with the present invention by a nonvolatile semiconductor memory comprising:

a memory cell region including a number of memory cells formed therein and each having a floating gate and a control gate formed above the floating gate, and a plurality of word lines extending in a first direction in parallel to each other, separately from each other; and a selection transistor region positioned adjacent to the memory cell region and including one selection transistor formed therein and a selection signal line extending in parallel to the word lines;

wherein the selection signal line is formed on an inactive region in a substrate to extend in parallel to a boundary line between the memory cell region and the selection transistor region.

In an embodiment of the nonvolatile semiconductor memory, the inactive region includes a device isolation region formed in a principal surface of the substrate and a thick oxide film covering a diffused region formed in the principal surface of the substrate. For example, the selection signal line includes a layer which is formed of the same material as that of the control gate, and extends in parallel to the boundary line between the memory cell region and the selection transistor region, at a position retracting from the boundary line between the memory cell region and the selection transistor region.

According to another aspect of the present invention, there is provided a nonvolatile semiconductor memory comprising;

a memory cell region including a number of memory cells formed therein and each having a floating gate and a control gate formed above the floating gate, and a plurality of word lines extending in a first direction in parallel to each other, separately from each other; and a selection transistor region positioned adjacent to the memory cell region and including one selection transistor formed therein and a selection signal line extending in parallel to the word lines;

wherein the selection signal line includes a first layer which is formed of the same material as that of the floating gate and a second layer which is formed of the same material as that of the control gate.

Preferably, the selection signal line includes a short selection signal line extending therefrom in a second direction orthogonal to the first direction and going apart from the memory cell region, an end of the short selection signal line constituting a gate of the selection transistor.

In addition, the selection signal line includes a side surface extending on and along the boundary line between the memory cell region and the selection transistor region.

In a preferred embodiment, the selection signal line includes a short selection signal line extending therefrom in a second direction orthogonal to the first direction and going apart from the memory cell region, an end of the short selection signal line constituting a gate of the selection transistor.

According to a third aspect of the present invention, there is provided a process for fabricating a nonvolatile semiconductor memory which has a memory cell region including a number of memory cells formed therein and each having a floating gate and a control gate formed above the floating gate, and a plurality of word lines extending in a first direction in parallel to each other, separately from each other, and a selection transistor region positioned adjacent to the memory cell region and including one selection transistor formed therein and a selection signal line extending in parallel to the word lines, the processing comprising the steps of:

forming a device isolation film on a principal surface of a semiconductor substrate, forming a tunnel insulator film for the memory cells on the principal surface of the semiconductor substrate, forming a floating gate film on the tunnel insulator film, partially patterning the floating gate film, and forming source/drain regions at opposite sides of the partially patterned floating gate film by using the partially patterned floating gate film as a mask; forming an oxide film to cover the whole surface of the semiconductor substrate, and etching back the oxide film until an upper surface of the partially patterned the floating gate film;

removing the partially patterned floating gate film from the selection transistor region;

forming on the whole surface of the semiconductor substrate an insulating film for insulating between the floating gate and the control gate, and removing the insulating film from the selection transistor region;

forming a gate insulator film for the selection transistor;

forming a polysilicon film on the whole surface of the semiconductor substrate;

selectively etching the polysilicon film and the partially patterned floating gate film under the polysilicon film within the memory cell region to form a control gate and a underlying floating gate while etching one side surface of the selection signal line, extending on and along a boundary line between the memory cell region and the selection transistor region; and selectively etching the polysilicon film within the selection transistor region to form a gate of the selection transistor while etching the other side surface of the selection signal line.

According to a fourth aspect of the present invention, there is provided a process for fabricating a nonvolatile semiconductor memory which has a memory cell region including a number of memory cells formed therein and each having a floating gate and a control gate formed above the floating gate, and a plurality of word lines extending in a first direction in parallel to each other, separately from each other, and a selection transistor region positioned adjacent to the memory cell region and including one selection transistor formed therein and a selection signal line extending in parallel to the word lines, the processing comprising the steps of:

forming a device isolation film on a principal surface of a semiconductor substrate so that the device isolation film extends over a boundary region between the memory cell region and the selection transistor region, forming a tunnel insulator film for the memory cells on the principal surface of the semiconductor substrate, forming a floating gate film on the tunnel insulator film, partially patterning the floating gate film, and forming source/drain regions at opposite sides of the partially patterned floating gate film by using the partially patterned floating gate film as a mask;

forming an oxide film to cover the whole surface of the semiconductor substrate, and etching back the oxide film until an upper surface of the partially patterned the floating gate film;

removing the partially patterned floating gate film from the selection transistor region;

forming on the whole surface of the semiconductor substrate an insulating film for insulating between the floating gate and the control gate, and removing the insulating film from the selection transistor region;

forming a gate insulator film for the selection transistor;

forming a polysilicon film on the whole surface of the semiconductor substrate;

selectively etching the polysilicon film and the partially patterned floating gate film under the polysilicon film within the memory cell region to form a control gate and a underlying floating gate by using a mask substantially completely covering the selection transistor region and having a side surface which slightly retracts from the boundary line between the selection transistor region and the memory cell region and which is still positioned on the device isolation region; and selectively etching the polysilicon film within the selection transistor region to form a gate of the selection transistor by using a mask substantially completely covering the memory cell region and having a side surface which slightly retracts from the boundary line between the selection transistor region and the memory cell region and which is still positioned on the device isolation region.

The above and other objects, features and advantages of the present invention will be apparent from the following description of preferred embodiments of the invention with reference to the accompanying drawings.

DETAILED DESCRIPTION OF THE INVENTION

Figure 1:
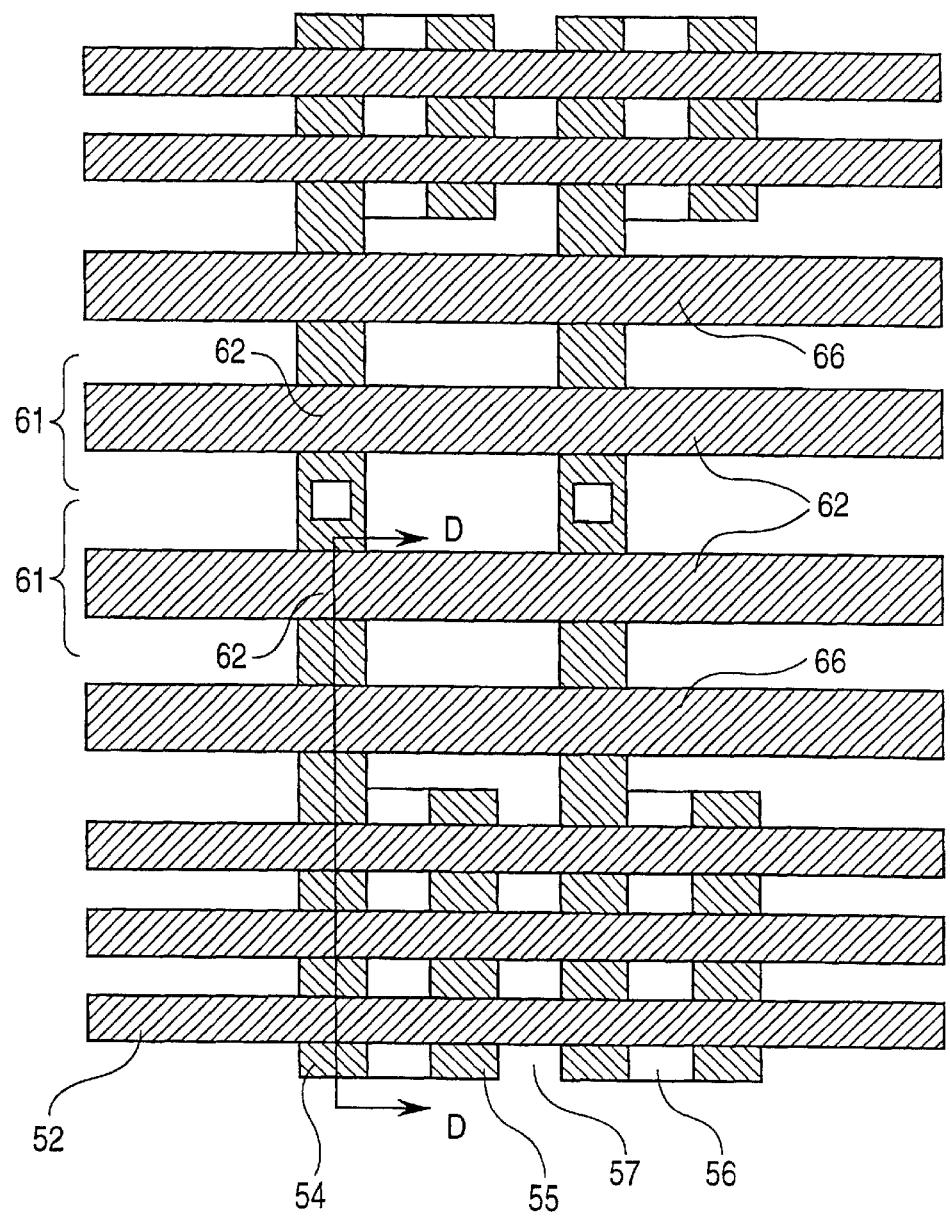
FIG. 1 is a diagrammatic plan view illustrating a prior art nonvolatile semiconductor memory.
Figure 2:
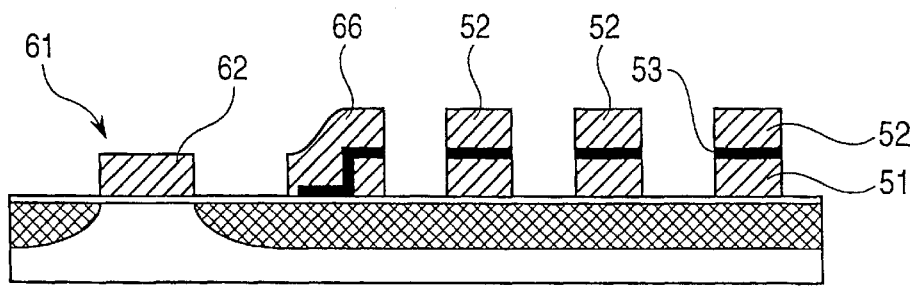
FIG. 2 is a diagrammatic sectional view taken along the line D—D in FIG. 1.
Figure 3A:
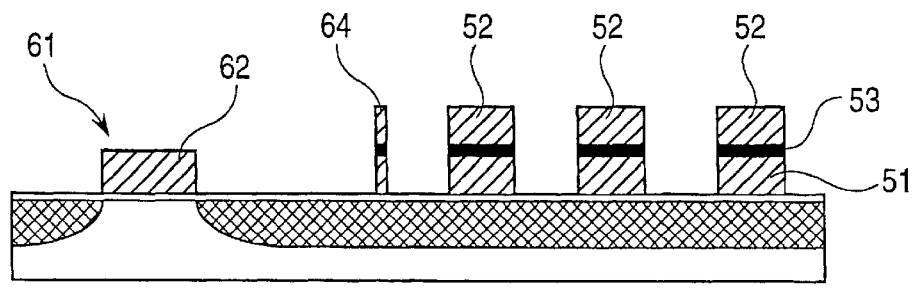
FIGS. 3A and 3B are views similar to that of FIG. 2 but showing different problems in the prior art nonvolatile semiconductor memory.
Figure 3B:
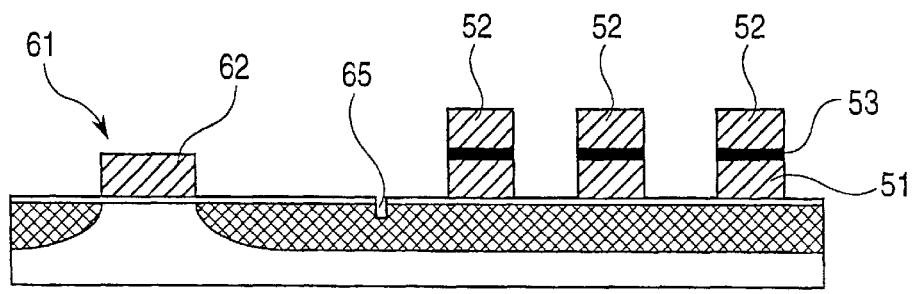
Figure 4:
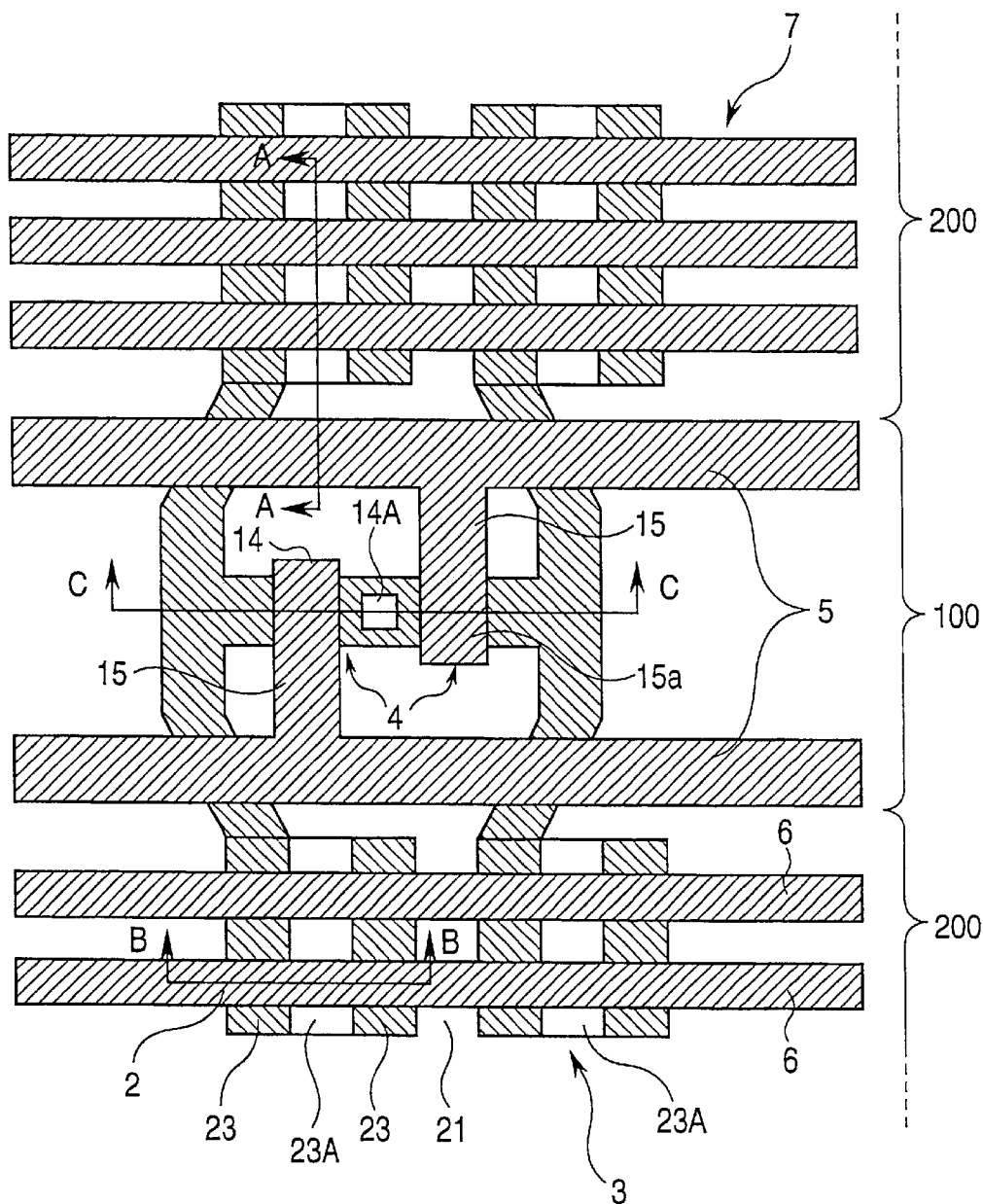
FIG. 4 is a diagrammatic plan view illustrating a first embodiment of the nonvolatile semiconductor memory in accordance with the present invention.

Referring to FIG. 4, there is shown a diagrammatic plan view illustrating a first embodiment of the nonvolatile semiconductor memory in accordance with the present invention, which is a flash memory.

As shown in FIG. 4, the shown nonvolatile semiconductor memory includes a selection transistor region 100 interposed between a pair of memory cell regions 200. In each memory cell region 200, a number of word lines 6 are formed to extend in parallel to each other.

Figure 5A:
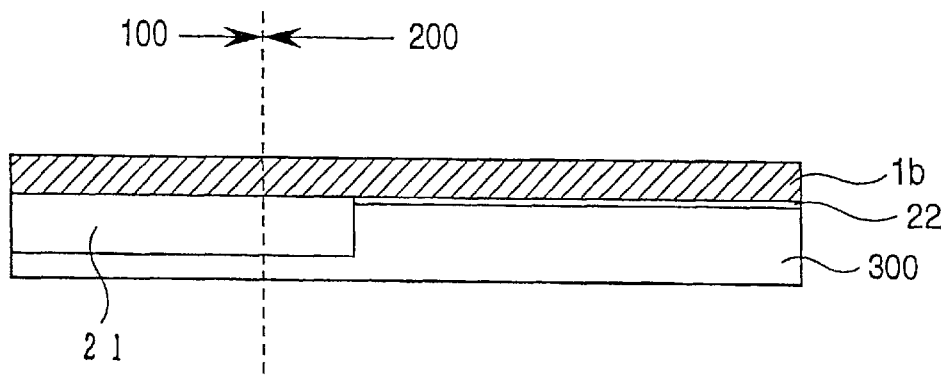
FIGS. 5A to 5F are diagrammatic sectional views taken along the line A—A in FIG. 4 to show a boundary region between a memory cell region and a selection transistor region, for illustrating a first embodiment of the process in accordance with the present invention for fabricating the nonvolatile semiconductor memory in accordance with the present invention.
Figure 5B:
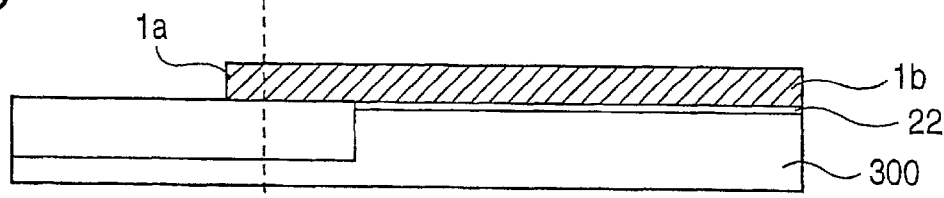
Figure 5C:
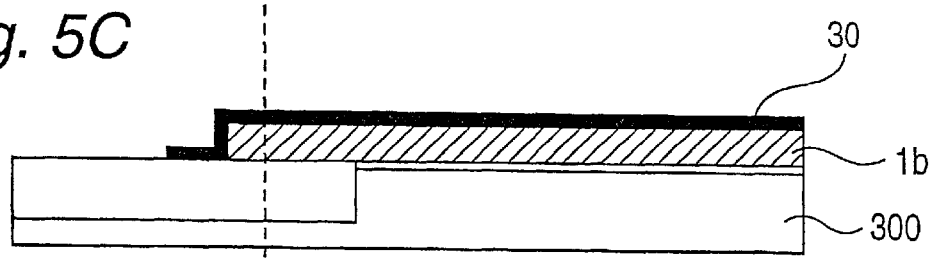
Figure 5D:
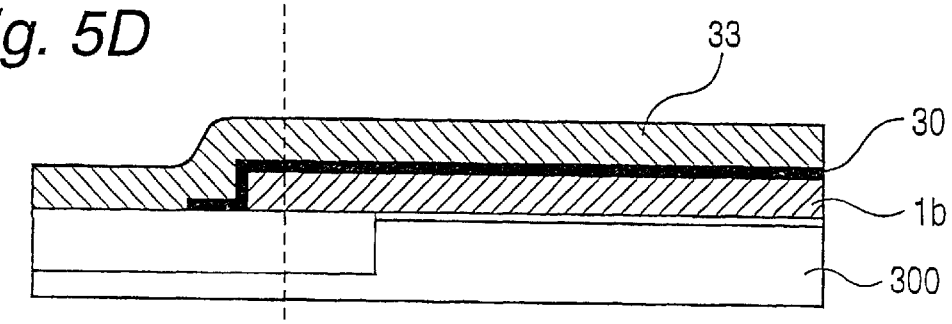
Figure 5E:
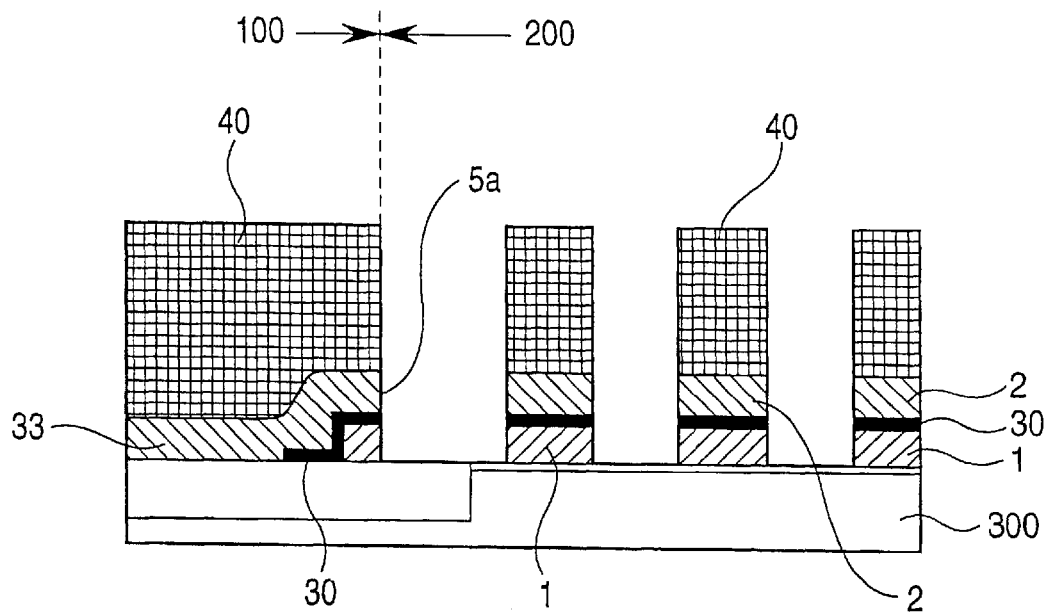
Figure 5F:
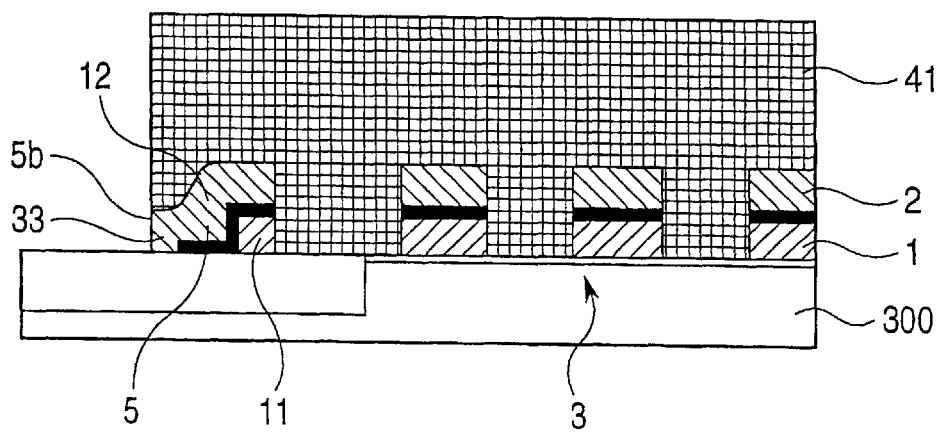

As shown in FIGS. 5E and 5F which are diagrammatic sectional views taken along the line A—A in FIG. 4 for illustrating an intermediate condition of the process for fabricating the nonvolatile semiconductor memory, the word line 6 constitutes a control electrode 2 of a floating gate MOS transistor, and under the control electrode 2, a floating gate 1 is formed, insulated from the control gate by an insulating layer 30.

Returning to FIG. 4, a pair of diffused source/drain regions 23 are formed at a surface region of a semiconductor substrate at opposite sides of the floating gate, respectively, and a surface region of the semiconductor substrate under the floating gate constitutes a channel region 23A. Thus, a number of memory cells 3 are formed in each memory cell region 200. Incidentally, the memory cells 3 are isolated by a device isolation region 21 from adjacent memory cells in the direction of the word line 6.

In the selection transistor region 100, two selection signal lines 5 are formed to extend in parallel to each other in the same direction as that of the word lines 6. Each of the selection signal lines 5 extends along a boundary of a corresponding memory cell region 200. As shown in FIGS. 5E and 5F, each of the selection signal lines 5 is composed of a first layer 11 which is formed of the same material as that of the floating gate 1 and a second layer 12 which is formed of the same material as that of the control gate 2.

As shown in FIG. 4, each of the two selection signal lines 5 has a short selection signal line 15 extending therefrom in a direction orthogonal to the selection signal line 5 toward the other selection signal line but in a staggered relation to the short selection signal line 15 extending from the other selection signal line. A tip end portion 15a of each short selection signal line 15 constitutes a gate 14 of a selection transistor 4.

Figure 7A:
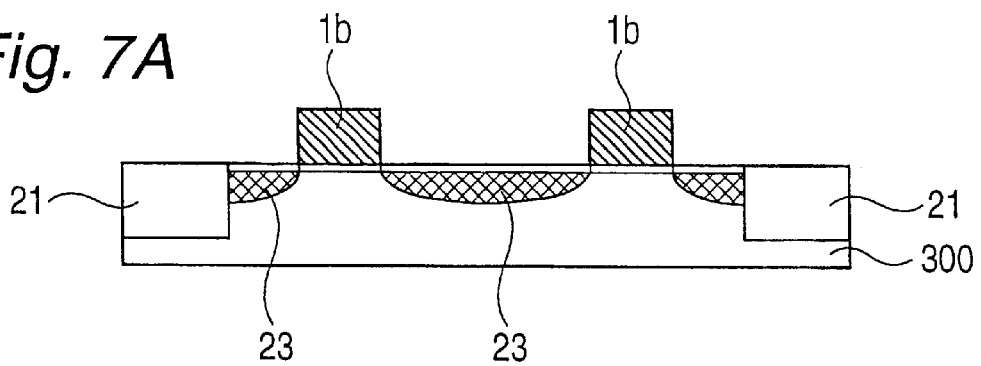
FIGS. 7A to 7I are diagrammatic sectional views taken along the line C—C in FIG. 4 to show the selection transistor region, for illustrating the first embodiment of the process in accordance with the present invention for fabricating the nonvolatile semiconductor memory in accordance with the present invention.
Figure 7B:
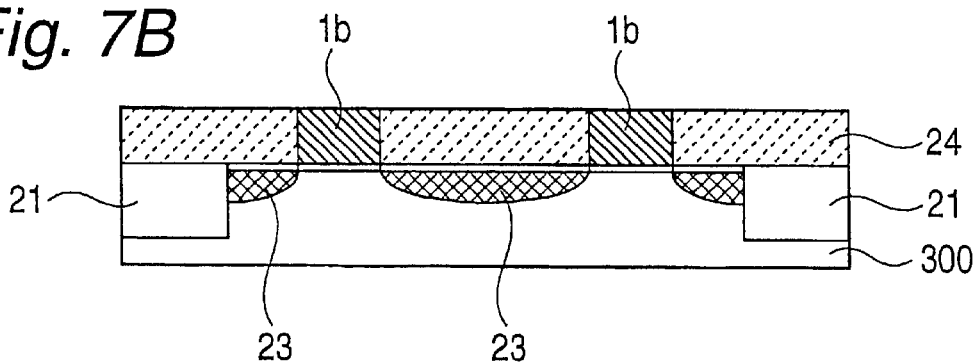
Figure 7C:
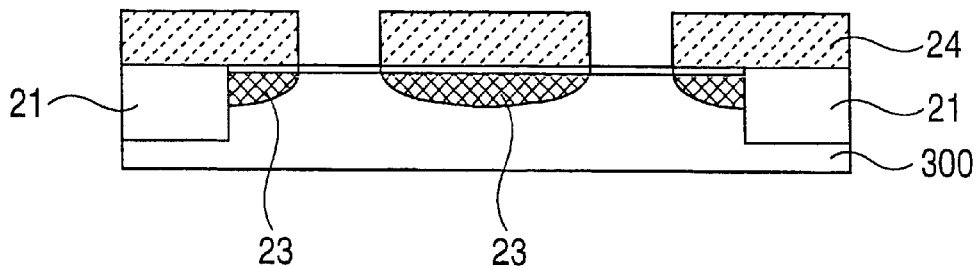
Figure 7D:
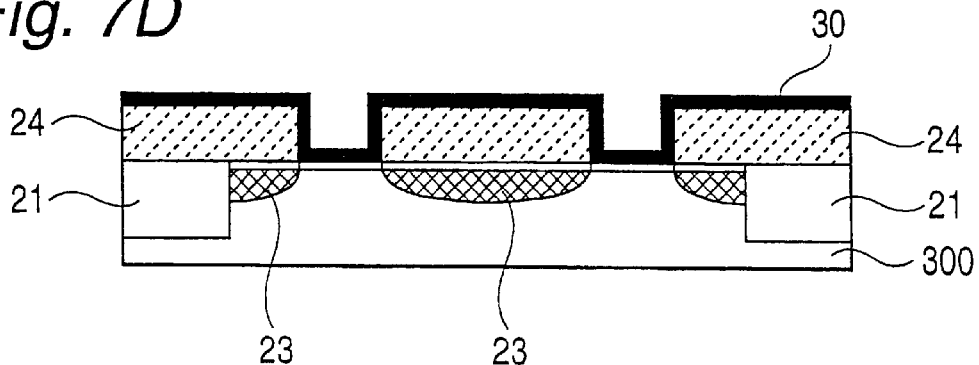
Figure 7E:
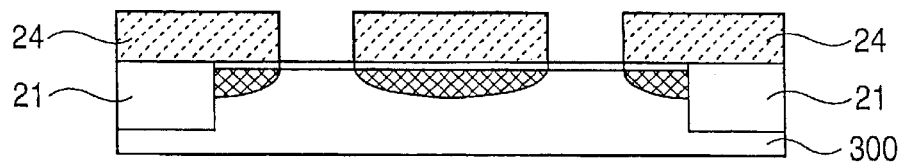
Figure 7F:
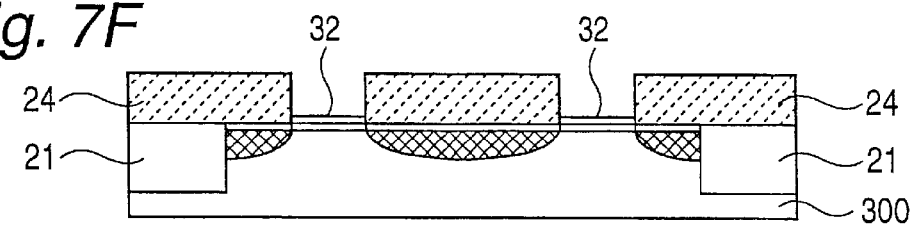
Figure 7G:
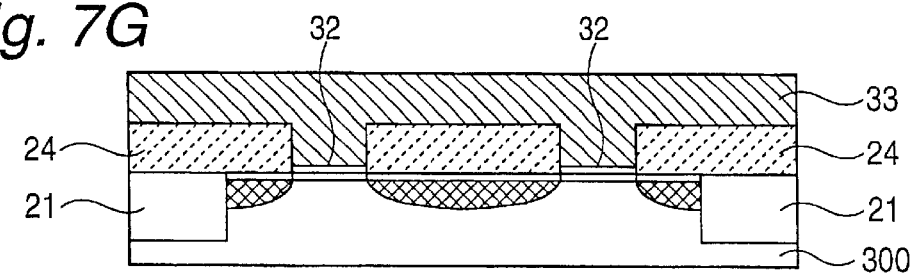
Figure 7H:
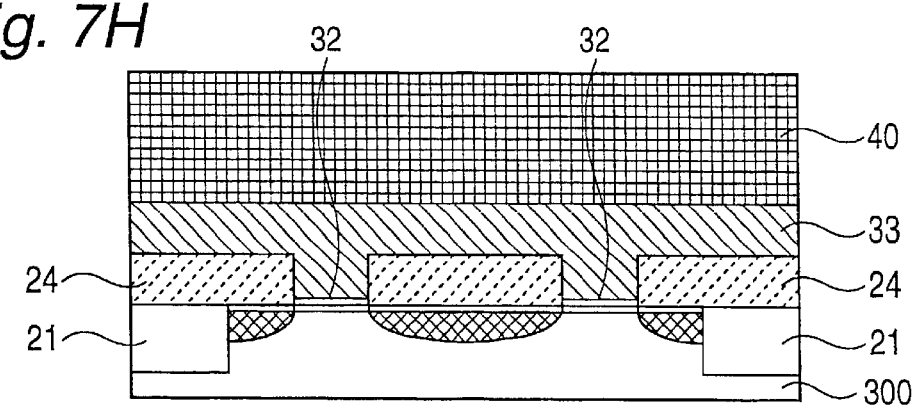
Figure 7I:
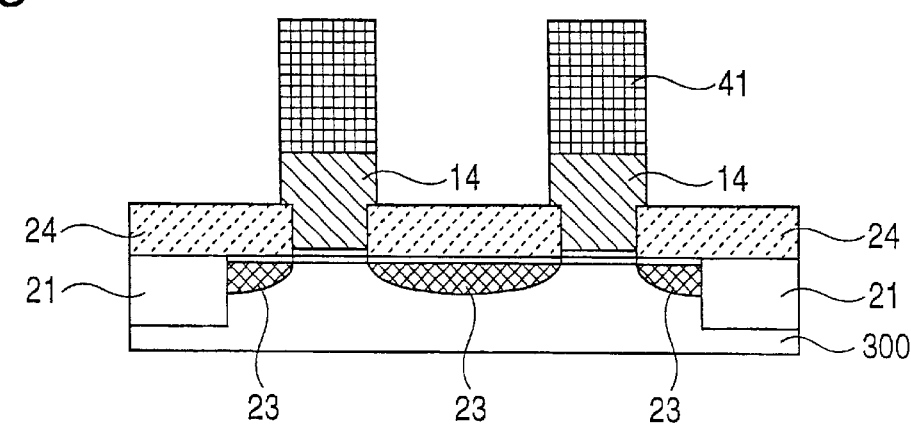

As shown in FIG. 7I which is a diagrammatic sectional view taken along the line C—C in FIG. 4 for illustrating an intermediate condition of the process for fabricating the nonvolatile semiconductor memory, a pair of diffused source/drain regions 23 are formed at a surface region of a semiconductor substrate at opposite sides of each gate 14, respectively. A surface region of the semiconductor substrate under the gate 14 constitutes a channel region. Thus, the selection transistor 4 is formed. As shown in FIG. 4, the common diffused source/drain region 23 of each two selection transistors 4 is connected through a contact 14A to an interconnection layer (not show, acting as a main bit line) of a different level, and the other of the pair of source/drain regions 23 in each selection transistor 4 joins with one (drain) of the pair of source/drain regions 23 of memory cells in one corresponding array orthogonal to the word lines 6.

Next, a first embodiment of the process in accordance with the present invention for fabricating the nonvolatile semiconductor memory in accordance with the present invention will be described with reference to FIGS. 5A to 5F which are diagrammatic sectional views taken along the line A—A in FIG. 4 to show a boundary region between a memory cell region and a selection transistor region, FIGS. 6A to 6E which are diagrammatic sectional views taken along the line B—B in FIG. 4 to show the memory cell region, and FIGS. 7A to 7I which are diagrammatic sectional views taken along the line C—C in FIG. 4 to show the selection transistor region.

Figure 6A:
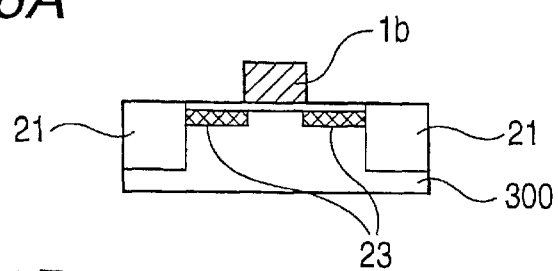
FIGS. 6A to 6E are diagrammatic sectional views taken along the line B—B in FIG. 4 to show the memory cell region, for illustrating the first embodiment of the process in accordance with the present invention for fabricating the nonvolatile semiconductor memory in accordance with the present invention.

After a device isolation film 21 is selectively formed in a principal surface of a semiconductor substrate 300, a tunnel insulator film 22 and a partially patterned floating gate film 1b is formed of polysilicon on the principal surface of the semiconductor substrate 300, and impurity is ion-implanted using the partially patterned floating gate film 1b as a mask, to form diffused source/drain regions 23 at opposite sides of each partially patterned floating gate film 1b in a surface region of the semiconductor substrate 300 confined by the device isolation film 21, as shown in FIGS. 5A, 6A and 7A.

Figure 6B:
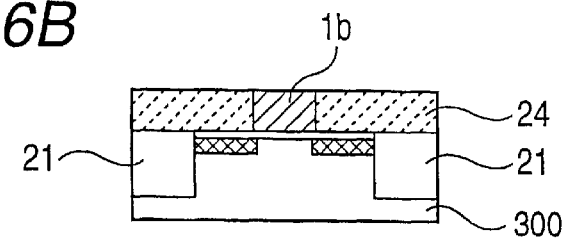

Further, after a thick oxide film 24 (of for example a 100 nm thickness) is formed to cover the source/drain regions 23, the oxide film 24 is etched back until an upper surface of the partially patterned floating gate film 1b is exposed, as shown in FIGS. 5A, 6B and 7B. Here, it is important that after the etching-back process, the source/drain regions 23 are still covered by the thick oxide film 24. In this connection, the method for forming the source/drain regions 23 is not limited to the method mentioned above, but it would be apparent to persons skilled in the art that the source/drain regions 23 can be formed by various methods other than the above mentioned method. In addition, in order to increase a capacitance ratio of the memory cell, a second floating gate can be formed to increase an overlapping area between the control gate and the floating gate.

Thereafter, the partially patterned floating gate film 1b in the selection transistor region 100 is selectively removed as shown in FIGS. 5B, 6B and 7C. At this time, as shown in FIG. 5B, the partially patterned floating gate film 1b is selectively etched so that an end portion 1a of the partially patterned floating gate film 1b projects from the memory cell region 200 to a center line of a selection signal line 5 formed in a later stage, with the result that the tunnel insulator film 22 is in no way exposed in the memory cell region 200. Therefore, an end face of the remaining portion 1a in the selection transistor region 100 corresponds to the center line of the selection signal line 5 formed in the later stage.

Figure 6C:
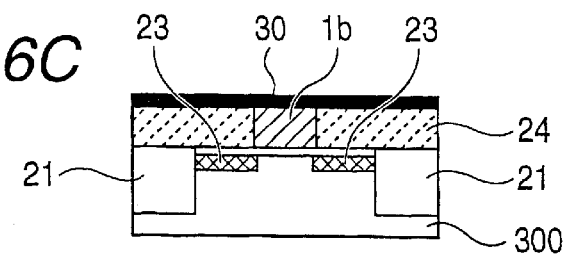

In order to insulate the floating gate 1 from the control gate 2, an ONO (oxide-nitride-oxide) film 30 is formed to cover the whole surface as shown in FIGS. 5C, 6C and 7D, and then, the ONO film 30 is selectively removed from the selection transistor region 100, as shown in FIGS. 5C, 6C and 7E. Here, the ONO film 30 is selectively removed so that the remaining ONO film 30 covers the end face of the end portion 1a of the partially patterned floating gate film 1b remaining in the selection transistor region 100.

Figure 6D:
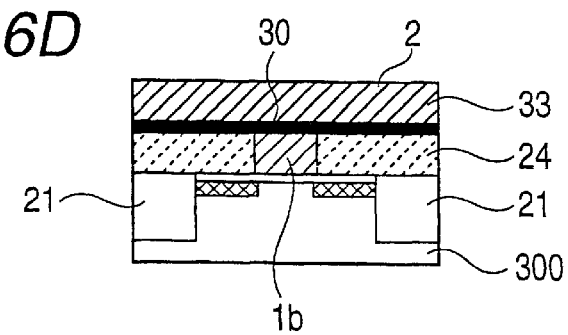

Furthermore, after a gate oxide film 32 is formed as shown in FIGS. 5C, 6C and 7F, a polysilicon film 33 is formed on the whole surface, as shown in FIGS. 5D, 6D and 7G. This polysilicon film 33 will become the control gate 2 (namely, the word line 6), the gate 14 of the selection transistor 4 and the selection signal line 5 after it is patterned in a later step. Thereafter, in order to reduce a resistance of the word line 6, tungsten silicide (WSi) can be deposited on the polysilicon film 33 by sputtering.

Figure 6E:
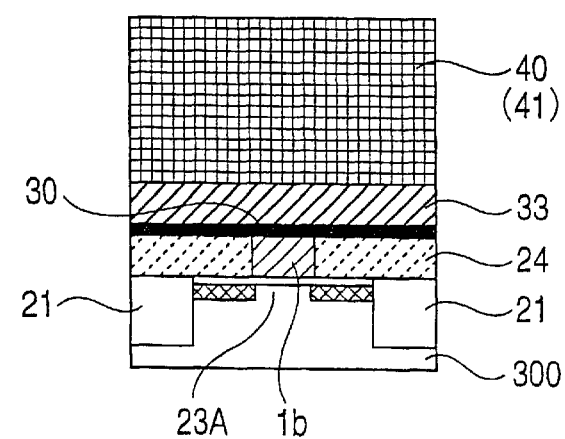

In order to form the control gates and the floating gates in the memory cell region 200 and in order to form the selection signal line 5 positioned at the boundary between the selection transistor region 100 and each memory cell region 200, a photo resist 40 is formed on the whole surface and then patterned as shown in FIGS. 5E, 6E and 7H, and the stacked layers consisting of the partially patterned floating gate film 1b, the ONO film 30 and the polysilicon film 33 in each memory region 200 is patterned by an etching as shown in FIGS. 5E, 6E and 7H. At this time, since the selection transistor region 100 is completely covered with the photo resist 40, the polysilicon film 33 in the selection transistor region 100 is not etched. On the other hand, since the stacked layers of the partially patterned floating gate film 1b, the ONO film 30 and the polysilicon film 33 remaining in the selection transistor region 100 is etched along a boundary line between the selection transistor region 100 and each memory cell region 200, the stacked layers of the partially patterned floating gate film 1b, the ONO film 30 and the polysilicon film 33 remaining in the selection transistor region 100 has a side face 5a exposed and extending along the boundary line between the selection transistor region 100 and each memory cell region 200.

Furthermore, in order to form the selection signal line 5, the short selection signal line 15a and the gate 14 in the selection transistor region 100, a photo resist 41 is formed on the whole surface and then patterned as shown in FIGS. 5F, 6E and 7I, and the polysilicon film 33 in the selection transistor region 100 is patterned by an etching as shown in FIGS. 5F, 6E and 7I. Thus, an opposite side surface 5b of the selection signal line 5 is formed. At this time, since the memory cell regions 200 are completely covered with the photo resist 41, the stacked structure consisting of the floating gate 1, the ONO film 30 and the control gate 2 is not etched. Furthermore, it is preferred to etch transistors in a peripheral circuit at this process. Thereafter, contacts and interconnections are formed in a conventional process to complete a flash memory cell array.

In the above mentioned process, the etching for forming the selection transistors and the etching for forming the memory cell transistors can be reversed in order with no problem.

In the above mentioned process, the portion la of the floating gate 1 remains at a side adjacent to the memory cell region, of a lower portion of the selection signal line. However, the floating gate portion 1a remaining at a side adjacent to the memory cell region, of the lower portion of the selection signal line, can be omitted.

Now, a process for forming the modified structure will be described with FIGS. 8A and 8B which are views similar to those of FIGS. 5E and 5F, but illustrating a second embodiment of the process in accordance with the present invention for fabricating the modified structure of the nonvolatile semiconductor memory in accordance with the present invention.

In this process, after the steps which are substantially the same as the steps shown in FIGS. 5A to 5D are performed, the partially patterned floating gate film 1b is selectively etched. At this time, the device isolation region 21 continuing from the selection transistor region 100 extends beyond a boundary line 110 between the selection transistor region 100 and the memory cell region 200, into the memory cell region 200. On the other hand, the end portion 1a of the partially patterned floating gate film 1b shown in FIG. 5B terminates on the boundary line 110 between the selection transistor region 100 and the memory cell region 200, differently from the condition shown in FIGS 5B to 5F.

Figure 8A:
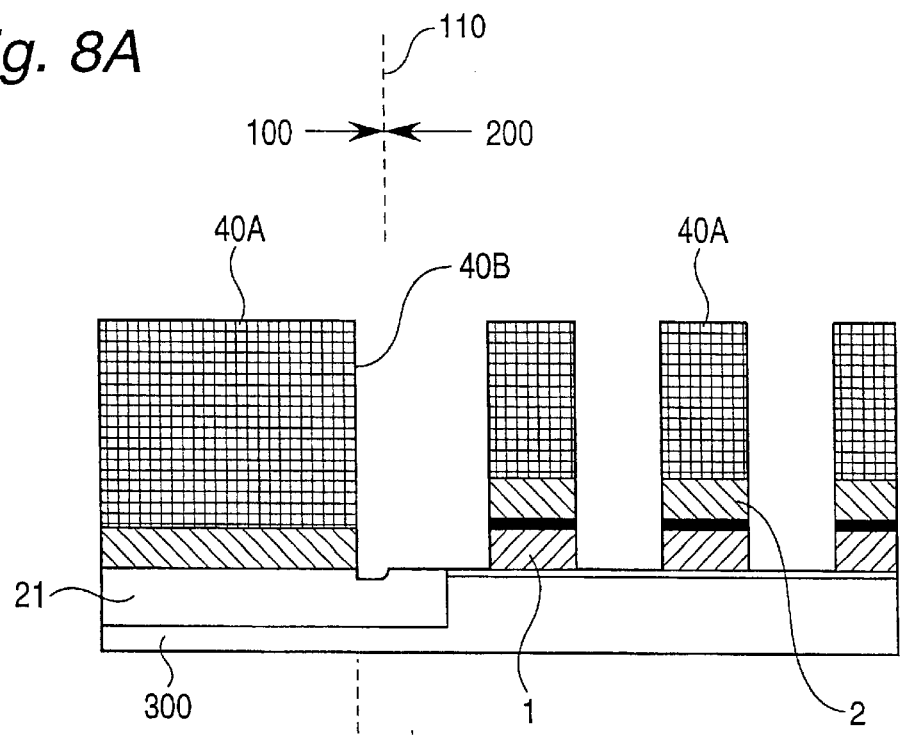
FIGS. 8A and 8B are views similar to those of FIGS. 5E and 5F, but illustrating a second embodiment of the process in accordance with the present invention for fabricating the nonvolatile semiconductor memory in accordance with the present invention.

When the control gates are formed in the memory cell regions 200, the photo resist 40A is so patterned that the patterned photo resist 40A substantially completely covering the selection transistor region 100 has a side surface 40B which intentionally slightly retracts from the boundary line 110 between the selection transistor region 100 and the memory cell region 200 and which is still positioned on the device isolation region 21 as shown in FIG. 8A. In the memory cell regions 200, on the other hand, the patterned photo resist 40A has a plan shape corresponding to the word lines 6. Thus, in only the memory cell regions 200, the stacked layers consisting of the partially patterned floating gate film 1b, the ONO film 30 and the polysilicon film 33 is patterned by an etching to form the word line 6 and the stacked structure consisting of the floating gate 1, the ONO film 30 and the control gate 2.

Figure 8B:
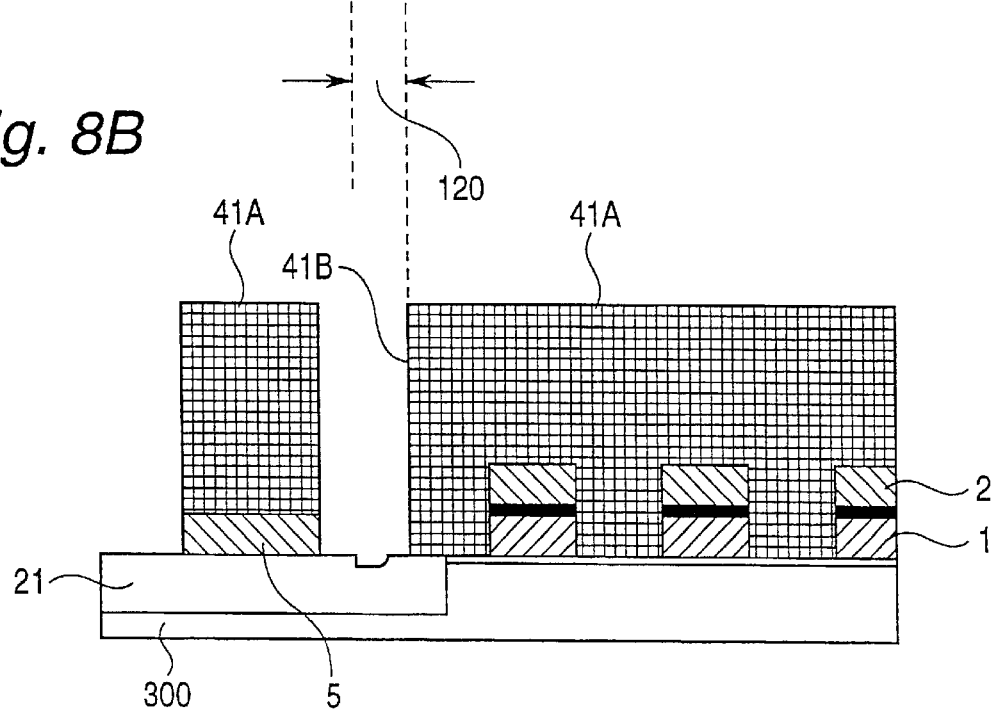

Then, when the selection signal lines and the gates are formed in the selection transistor region 100, the patterned photo resist 41A is so formed that the patterned photo resist 41A substantially completely covering the memory cell region 200 has a side surface 41B which intentionally slightly retracts from the boundary line 110 between the selection transistor region 100 and the memory cell region 200 and which is still positioned on the device isolation region 21 continuing from the selection transistor region 100 to extend beyond the boundary line 110 into the memory cell region 200, as shown in FIG. 8B. In the selection transistor region 100, on the other hand, the patterned photo resist 41A has a plan shape corresponding to the selection signal line 5, the short selection signal line 15a and the gate 14.

In this modified process, a region 120 on the substrate 300 between the side surface 40B of the photo resist 40A and the side surface 41B of the photo resist 41A is subjected to the etching two times. Therefore, the thickness of the oxide film in this region 120 (namely, the thickness of the thick oxide film 24 covering the diffused region 23 at a location where the selection signal line 5 crosses the diffused region 23 as shown in FIG. 4) is required to be thick enough to resist the etching of two times. For this purpose, the thick oxide film 24 is required to have the thickness of not less than 150 nm. In other words, the region 120 is provided to absorb the misalignment between the photo resist 40A and the photo resist 41A in a photolithographic process. Therefore, a mask pattern for the photo resist 40A and a mask pattern for the photo resist 41A are so formed that even if the misalignment between the photo resist 40A and the photo resist 41A is maximum, there certainly occurs the region 120 etched two times.

In this modified process, the etching for forming the selection transistors and the etching for forming the memory cell transistors can be reversed in order with no problem.

In the first embodiment of the process in accordance with the present invention for fabricating the nonvolatile semiconductor memory in accordance with the present invention, the selection signal line 5 is composed of the first layer 11 which is formed of the same material as that of the floating gate 1 and the second layer 12 which is formed of the same material as that of the control gate 2. On the other hand, in the second embodiment of the process in accordance with the present invention for fabricating the nonvolatile semiconductor memory in accordance with the present invention, the selection signal line 5 is composed of only a layer which is formed of the same material as that of the control gate 2. However, the selection signal line 5 can be composed of a first layer which is formed of the same material as the insulating film 30 for insulating between the floating gate 1 and the control gate 2, and a second layer 12 which is formed of the same material as that of the control gate 2.

Now, an operation of the above mentioned nonvolatile semiconductor memory in accordance with the present invention will be described.

When data is written, a positive voltage (about 7V) is applied to the gate 14 of the selection transistor 4 in order to electrically connect a main bit line to a sub-bit line reaching a memory cell to be written. At this time, this positive voltage (about 7V) is simultaneously applied to the gate of all the selection transistors connected in common to the selection signal line 5 to which the positive voltage (about 7V) is applied.

Then, a negative voltage (about −10V) is applied to the word line of the memory cell to be written, and a positive voltage (about 5V) is applied to the drain (sub-bit line) of the memory cell to be written, through the diffused layer of the turn-on selection transistor. As a result, an electric field is applied between the floating gate and the drain of the memory cell to be written, so that a Fowler-Nordheim tunnel current flows to pull out electrons from the floating gate to the drain.

Ordinarily, in order to elevate the writing speed, the positive voltage is applied to the sub-bit line of a plurality of memory cells having the common word line but selected by the selection transistors, so that the writing is simultaneously to the plurality of memory cells.

When data is erased, a positive voltage (about 12V) is applied to the word line of the memory cell to be erased, and a negative voltage (−5V) is applied to the source and the well of the memory cell to be erased. Ordinarily, all the selection signal lines are grounded to maintain the drain in a floating condition. Thus, an electric field is generated between the floating gate and the channel by the application of the above mentioned voltages, so that a Fowler-Nordheim tunnel current flows to inject electrons from the channel to the floating gate.

When data is read out, a positive voltage (about 7V) is applied to the gate 14 of the selection transistor 4, and a positive voltage (about 5V) is applied to the word line of the memory cell to be read out, and a positive voltage (about 1V) is applied to the drain (sub-bit line) of the memory cell to be read out, so that a current flowing through the memory cell is detected. If the electrons are accumulated in the floating gate of the memory cell (the erased condition), the current does not flow in the memory cell. If the electrons are not accumulated in the floating gate of the memory cell (the written condition), the current flows in the memory cell. Thus, the read-out data is discriminated by detecting whether or not the current flows in the memory cell.

Incidentally, lastly, the number of electrons accumulated in the floating gate is adjusted so that the number of accumulated electrons can be divided into four or more levels, and therefore, the magnitude of the read-out current can be distinguished in accordance with the four or more levels in the number of accumulated electrons, with the result that data of two or more bits can be stored in one memory cell. The semiconductor memory in accordance with the present invention can be controlled by this method.

As mentioned above, since the nonvolatile semiconductor memory in accordance with the present invention is so configured that the dummy gate line which was necessary in the prior art is no longer necessary, the chip size can be reduced.

The invention has thus been shown and described with reference to the specific embodiments. However, it should be noted that the present invention is in no way limited to the details of the illustrated structures but changes and modifications may be made within the scope of the appended claims.

What is claimed is:

1. A nonvolatile semiconductor memory comprising:
a memory cell region including a number of memory cells formed therein and each having a floating gate and a control gate formed above said floating gate, and a plurality of word lines extending in a first direction in parallel to each other, separately from each other; and
a selection transistor region positioned adjacent to said memory cell region and including one selection transistor formed therein and a selection signal line extending in parallel to said word lines, said selection transistor electrically connecting a first source and drain region of said selection transistor that is connected to a main bit line to a second source/drain region of said selection transistor that is connected to at least one of said memory cells, said selection signal line having a first side in said memory cell region that has a double layer of polysilicon and a second side in said selection transistor region that has only a single layer of polysilicon;
wherein said selection signal line is formed on an inactive region in a substrate to extend in parallel to a boundary line between said memory cell region and said selection transistor region.

2. A nonvolatile semiconductor memory claimed in claim 1 wherein said inactive region includes a device isolation region formed in a principal surface of said substrate and a thick oxide film covering a diffused region formed in said principal surface of said substrate.

3. A nonvolatile semiconductor memory claimed in claim 2 wherein said double layer of polysilicon of said selection signal line includes a first layer which is formed of the same material as that of said floating gate and a second layer which is formed of the same material as that of said control gate.

4. A nonvolatile semiconductor memory claimed in claim 3 wherein said selection signal line includes a short selection signal line extending therefrom in a second direction orthogonal to said first direction and going apart from said memory cell region, an end of said short selection signal line constituting a gate of said selection transistor.

5. A nonvolatile semiconductor memory claimed in claim 4 wherein said selection signal line includes a side surface extending on and along said boundary line between said memory cell region and said selection transistor region.

6. A nonvolatile semiconductor memory claimed in claim 1 wherein said single layer of polysilicon of said selection signal line includes a layer which is formed of the same material as that of said control gate, and extends in parallel to said boundary line between said memory cell region and said selection transistor region, at a position retracting from said boundary line between said memory cell region and said selection transistor region.

7. A nonvolatile semiconductor memory claimed in claim 6 wherein said selection signal line includes a short selection signal line extending therefrom in a second direction orthogonal to said first direction and going apart from said memory cell region, an end of said short selection signal line constituting a gate of said selection transistor.

8. A nonvolatile semiconductor memory comprising:
a memory cell region including a number of memory cells formed therein and each having a floating gate and a control gate formed above said floating gate, and a plurality of word lines extending in a first direction in parallel to each other, separately from each other; and
a selection transistor region positioned adjacent to said memory cell region and including one selection transistor formed therein and a selection signal line extending in parallel to said word lines, said selection transistor electrically connecting a first source/drain region of said selection transistor that is connected to a main bit line to a second source/drain region of said selection transistor that is connected to at least one of said memory cells;

wherein said selection signal line includes a portion in said memory cell region that includes a first layer which is formed of the same material as that of said floating gate and a second layer which is formed of the same material as that of said control gate and a portion in said selector transistor region that includes said second layer and not said first layer.

9. A nonvolatile semiconductor memory claimed in claim 8 wherein said selection signal line includes a short selection signal line extending therefrom in a second direction orthogonal to said first direction and going apart from said memory cell region, an end of said short selection signal line constituting a gate of said selection transistor.

10. A nonvolatile semiconductor memory claimed in claim 9 wherein said selection signal line includes a side surface extending on and along said boundary line between said memory cell region and said selection transistor region.

11. A nonvolatile semiconductor memory comprising:

two spaced apart memory cell regions that each comprise plural word lines extending in a first direction and plural memory cells; and a selection transistor region between said two memory cell regions, said selection transistor region comprising two selection signal lines, each extending in the first direction at a boundary between said selection transistor region and a different one of said two memory cell regions, and two selection transistors, one for each of said two memory cell regions, each of said two selection signal lines having a branch extending toward the other of said two selection signal lines, said two branches being spaced apart in the first direction, each of said two branches being a gate for a different one of said two selection transistors, and said two selection transistors having a common source/drain in a space between said two branches and separate drains/sources that connect to corresponding drains/sources of respective ones of said plural memory cells.

12. The memory of claim 11, wherein said two selection signal lines are each formed on a device isolation region that extends to a principal surface of a substrate.

13. The memory of claim 11, wherein each of said memory cells comprises a control gate on a floating gate and wherein said two selection signal lines each include a first layer that is the same material as said floating gate and a second layer that is the same material as said control gate.

14. The memory of claim 11, wherein said two selection signal lines each includes a side surface that extends on and along a respective said boundary.

* * * * *